United States Patent [19]

Tsuji et al.

[11] Patent Number: 4,868,922
[45] Date of Patent: Sep. 19, 1989

[54] DATA MODULATION/DEMODULATION SYSTEM UTILIZING DEMODULATION CLOCKS THAT DIFFER IN PHASE

[75] Inventors: Kentaro Tsuji, Nara; Tsuneo Fujiwara, Tenri; Shigemi Maeda, Yamatokoriyama; Taeshi Yamaguchi, Tenri; Toshihisa Deguchi; Shozou Kobayashi, both of Nara, all of Japan

[73] Assignee: Sharp Kabushiki Kaisha, Osaka, Japan

[21] Appl. No.: 8,964

[22] Filed: Jan. 30, 1987

[30] Foreign Application Priority Data

Jan. 31, 1986 [JP] Japan .................. 61-20448

[51] Int. Cl.⁴ .................. G11B 20/10; G06F 11/00
[52] U.S. Cl. .................. 360/51; 360/40; 360/53
[58] Field of Search .................. 360/29, 40, 47, 51, 360/53; 371/67, 68, 70

[56] References Cited

U.S. PATENT DOCUMENTS

| | | | |
|---|---|---|---|
| 2,950,464 | 8/1960 | Hinton et al. | 360/47 |
| 3,934,131 | 1/1976 | Perschy | 371/70 |
| 3,978,327 | 8/1976 | Huber | 371/68 |
| 4,011,542 | 3/1977 | Baichtal et al. | 371/68 |
| 4,369,516 | 1/1983 | Byrns | 360/40 |
| 4,442,521 | 4/1984 | Inaba et al. | 371/67 |
| 4,538,189 | 8/1985 | Fitzpatrick | 360/40 |

FOREIGN PATENT DOCUMENTS

| | | | |
|---|---|---|---|
| 0144813 | 11/1984 | European Pat. Off. | |
| 0027247 | 2/1983 | Japan | 371/70 |
| 0093844 | 6/1985 | Japan | 371/70 |

OTHER PUBLICATIONS

Abstract "Magnetic Recording and Modulating Circuit", 57-112,781.
IBM Technical Disclosure Bulletin; vol. 27, #7B, Dec. 1984; "Mark Generation in 2,7 Code".
IBM Technical Disclosure Bulletin; vol. 23, #4, Sep. 1989, "Encoding and Decoding Checking Arrangement for 2-Run-length Limited Codes".
IBM Technical Disclosure Bulletin, vol. 23, #4, Sep. 1980, "Phase Setting for A (2, 7) Code Decoder".
IBM Technical Disclosure Bulletin, vol. 23, #1, Jun. 1980, "1F/2F Phase Alignment System".

Primary Examiner—Alan Faber
Assistant Examiner—Surinder Sachar
Attorney, Agent, or Firm—Birch, Stewart, Kolasch & Birch

[57] ABSTRACT

A data modulation/demodulation system reproducing data that is divided and recorded in a plurality of blocks on a recording medium. The data modulation/demodulation system utilizes the steps of modulating the data by adding specified data bit patterns to the data bits of each block and reproducing the data which have been obtained by adding specified code bit patterns. The bit rows are independently demodulated by demodulation clocks which differ in phase. The demodulation bit pattern of the above code bit pattern which was added at the time of recording and the bit pattern which was demodulated by the different modulation clocks are compared with each other to determine which data is wrong. The correct demodulated data is selected according to this comparison and transmitted.

4 Claims, 3 Drawing Sheets

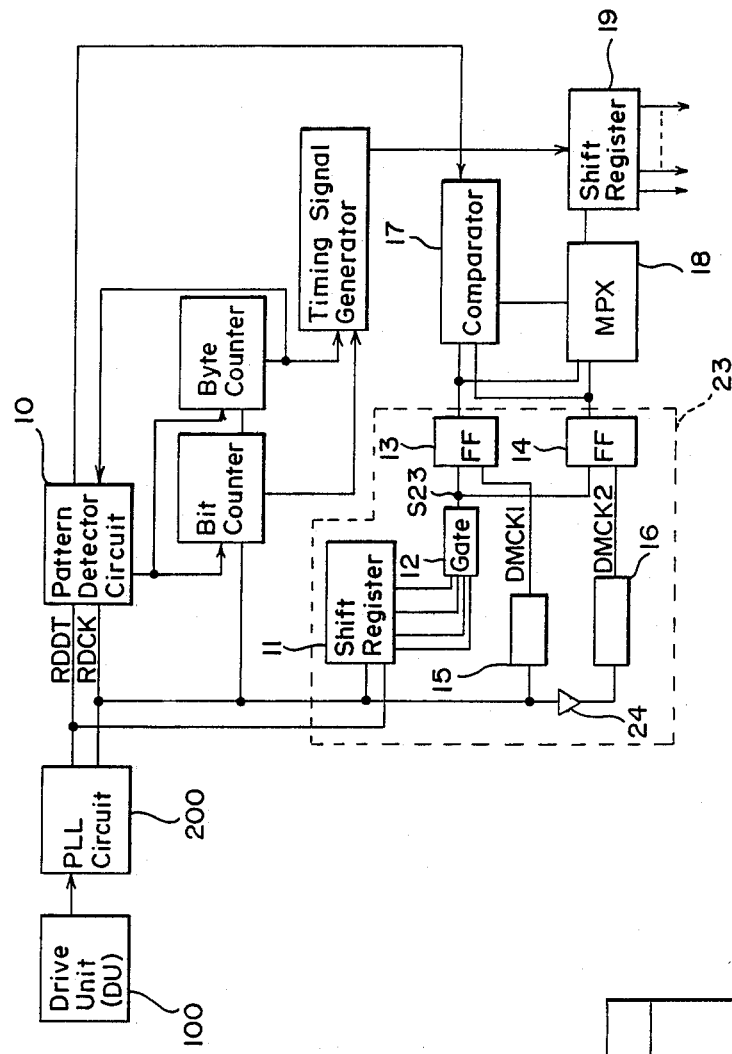

DATA MODULATION/DEMODULATION SYSTEM UTILIZING DEMODULATION CLOCKS THAT DIFFER IN PHASE

BACKGROUND OF THE INVENTION

The present invention relates to a data demodulation system that can be used in magnetic recording, optical recording, etc.

One of the conventional sequential coding methods using constant ratio data codes of variable word length, for example, the 2-7 modulation/demodulation system is disclosed in the Japanese Unexamined Patent Publication Sho. 50-142131. In the 2-7 modulation/demodulation system, as shown in FIG. 2, 2-bit codes are used for 1-bit data, and when demodulating, in order to convert 2-bit codes into original 1-bit data, a demodulation clock DMCK is needed.

FIG. 3 refers to an example of a conventional demodulation circuit employed in the 2-7 modulation/demodulation system, in which the read data RDDT is introduced into a shift register 11 clocked by a read clock RDCK, and the output of the shift register 11 is introduced into a logic gate circuit 12. This output is synchronized by the ½ period read clock RDCK that has been introduced into a demodulation clock generator circuit 13, to produce a demodulated clock signal, clock DMCK, thereby obtaining demodulated data S20.

Thus, in the conventional circuit, since the modulation clock DMCK was obtained by compressing the read clock RDCK to ½ period by flip-flop 22 and AND gate 21, if wrong inversion occurred in the demodulation clock DMCK due to noise or other cause, all the subsequent demodulate data S20 would be wrong.

SUMMARY OF THE INVENTION

The present invention is intended to solve the above-discussed problems, and it is hence a primary objective of the present invention to minimize the errors in demodulated data if wrong inversion should occur in the demodulation clock.

It is another objective of the present invention to present a data demodulation system of advanced reliability and its apparatus being capable of returning to normal operation in a next block if a wrong inversion occurs in the demodulation clock in any previous block due to skipping, overflowing or other cause of the read clock by possessing two demodulation clocks differing in phase.

Other objectives and further scope of applicability of the present invention will become apparent from the detailed description given hereinafter. It should be understood, however, that the detailed description of and specific examples, while indicating preferred embodiments of the invention, are given by way of illustration only, since various changes and modifications within the spirit and scope of the invention will become apparent to those skilled in the art from this detailed description.

To achieve the above objectives, the data demodulation system in one of the embodiments of this invention relates to a system for reproducing the data being divided and recorded in plural blocks in a recording medium, comprising the steps of modulating by adding specified data bit patterns to the data bits of the dividing portions of each block, and reproducing the data from the recording medium from which record patterns have been obtained by adding specified code bit patterns after modulation, wherein bit rows are independently demodulated by demodulation clocks differing mutually in phase. The demodulation bit pattern of the above code bit pattern added at the time of recording and the bit pattern demodulated by the different demodulation clock are compared with each other to check if the data is wrong or not. The correct demodulated data is selected according to this comparison and delivered.

BRIEF DESCRIPTION OF THE DRAWINGS

The present invention will become more fully understood from the detailed description given hereinbelow and the accompanying drawings which are given by way of illustration only, and thus are not limitative of the present invention and wherein:

FIG. 1 is a block diagram of a system configuration for performing the demodulation system according to the present invention;

FIG. 2 is a explanatory diagram to show the coding type of the 2-7 modulation/demodulation system;

DETAILED DESCRIPTION OF THE INVENTION

Figure 3:
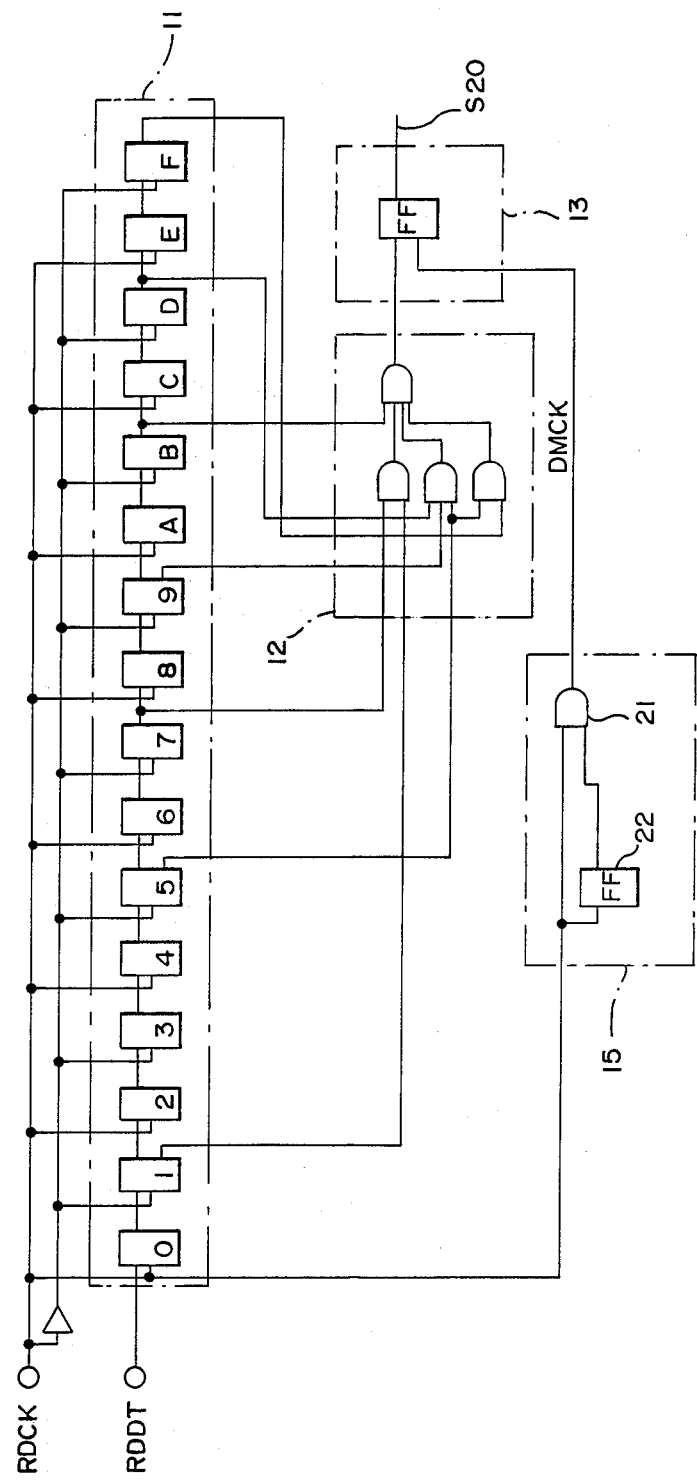
FIG. 3 is a circuit diagram of a conventional demodulation circuit.

Referring now to the drawings, the present invention is described below in details, specifically relating to some of its embodiments.

Figure 4:
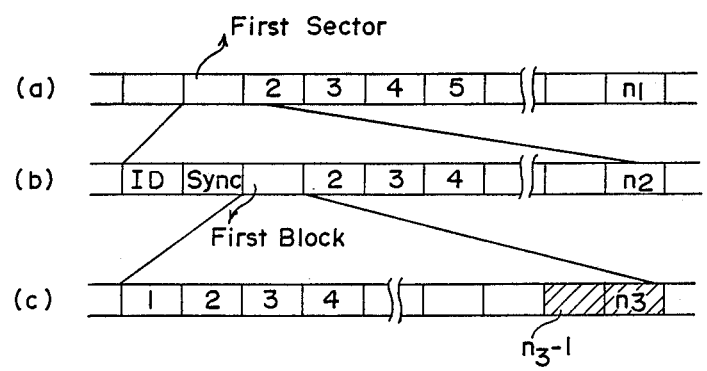
FIG. 4 is a explanatory diagram of a recording format in recording medium.

FIG. 4 is an example of recording format employed in magnetic recording, optical recording, etc. FIG. 1 is a block diagram of the system configuration for the demodulation system of the present invention. The tracks on the recording medium are, for example, divided into $n_1$ sectors as shown in FIG. 4 (a).

A drive unit (DU) 100 in FIG. 1 writes data into the units of these sectors. Each sector is composed of, as shown in FIG. 4 (b), a control signal area comprising ID, SYNC, etc., and a user data recording area comprising $n_2$ blocks, and each block is composed of $n_3$ bytes as shown in FIG. 4 (c), and in the beginning or at the end of this block, a resynchronization signal composed of specified data bit pattern and code bit pattern is written.

The above specified data bit pattern and code bit pattern are briefly described below.

Figure 5:
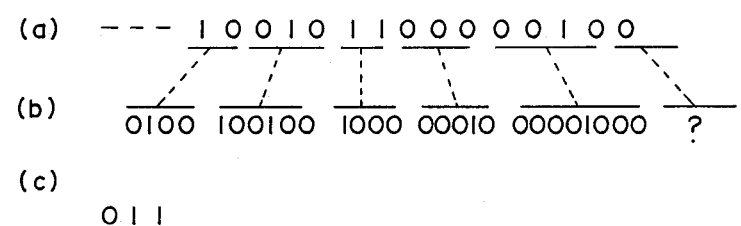
FIG. 5 and FIG. 6 are explanatory diagrams of bit patterns.

The data bit pattern is the bit pattern before modulation, and it is a row of consecutive data, for example, a data row as shown in FIG. 5 (a). When this bit pattern is 2-7 modulated, as shown in FIG. 5 (b), and since the 2-7 modulation/demodulation system is variable in word length, a bit pattern not satisfying the 2-7 conversion rule may occur at the end of the data row or in the dividing portion of the blocks. Accordingly, a specified data bit pattern is added to satisfy the 2-7 conversion rule.

Here, as an example, a specified data bit pattern as shown in FIG. 5 (c) is applied.

Meanwhile, the specified code bit pattern is a bit pattern after modulation, and it is used in the detection of the beginning part of a block when demodulating. Considering such functional situation, to enhance the reliability, a pattern not produced by 2-7 conversion code, such as a code bit pattern shown in FIG. 6 (a) is preferable. Here, in the pattern of FIG. 6 (a), part (1) is same as the pattern after modulation of specified data bit pattern shown in FIG. 5 (c), and by adding a pattern of (2) in FIG. 6 (a) to this data row, a pattern outside the 2-7 conversion rule is obtained. When the pattern of FIG. 6 (a) is demodulated, the result will be always the pattern of FIG. 6 (b).

In the system shown in FIG. 1, the data being read out by the drive unit (DU) 100 for recording and reproducing the data is synchronized by a PLL circuit 200, from which read data RDDT and read clock RDCK are delivered. These RDDT and RDCK are fed into a pattern detector circuit 10 composed of shift register and pattern discriminator, and a 2-7 demodulation circuit 23. The pattern detector circuit 10 discriminates the RDDT, and detects the specified code bit pattern and SYNC pattern, and delivers the detected signals. The RDDT which is fed into the 2-7 demodulation circuit 23 is converted to parallel data by the shift register 11, and is assembled by a gate circuit 12 to be returned as serial data S23. The read clock RDCK is directly divided into RDCK and $\overline{RDCK}$ through NOT circuit 24, and they are respectively fed into demodulation clock generator circuits 15 and 16. Demodulation clock signals DMCK1 and DMCK2 generated by these generator circuits 15 and 16 are respectively fed into flip-flops (FF) 13 and 14. In the flip-flops (FF) 13 and 14, the serial data S23 is synchronized to be converted into the data before modulation, but since the data is demodulated in the flip-flops (FF) 13 and 14 by the demodulation clocks DMCK1 and DMCK2 differing in phase, the output data will be different, and only one of the outputs will be the original data before modulation.

Figure 6:
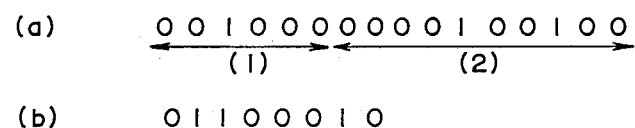

The outputs of the flip-flops (FF) 13 and 14 are fed into a comparator 17, which receives a detection signal corresponding to the specified code bit pattern shown in FIG. 6 (a) from the pattern detector circuit 10, and according to this detection signal, the bit pattern of FIG. 6 (b) and the outputs of the flip-flops (FF) 13 and 14 are compared. A judgement signal corresponding to this comparison is then generated and delivered to a multiplexer (MPX) 18. The multiplexer (MPX) 18 receives this judgement signal and selects the output from either flip-flop 13 or 14 on every occasion so that the correct data is delivered to a shift register 19.

The present invention, because of the processing stated above, can keep the spread of error in the demodulated data to a minimum if a wrong inversion should occur in the read clock RDCK. Besides, as shown in FIG. 1, having two demodulation clock generator circuits 15 and 16 generating a normal demodulation clock signal DMCK1 and an inverted demodulaton clock signal DMCK2, if a wrong inversion should occur in the normal demodulation clock DMCK1, the multiplexer (MPX) selects the demodulated created by the demodulation clock signal DMCK2, so that the data error is limited only within that block, thereby allowing the performance of normal demodulation in the subsequent blocks.

As clearly seen in the description above, the present invention, having two demodulated clocks differing in phase, if a wrong inversion should occur in the demodulation clock in any block due to skipping, overflow or other cause from the read clock, normal operation is restored in the next block, so that the reliability of the demodulated data may be enhanced. Meanwhile, in order to operate securely, detection of the beginning portion of the block is important, and in the present invention, by using a pattern not produced by the combination of 2-7 conversion code, that is, by using a pattern which is not produced in the code data, the beginning of a block can be detected without fail. Incidentally, the pattern of FIG. 6 (a) may be also used as the bit pattern of SYNC information.

While only certain embodiments of the present invention have been described, it will be apparent to those skilled in the art that various changes and modifications may be made therein without departing from the spirit and scope of the present invention as claimed.

What is claimed is:

1. A data modulating/demodulating method of reproducing correct data which has been divided and recorded in a plurality of blocks on a recording medium, comprising the steps of:
    (a) recalling data recorded in the plurality of blocks from the recording medium;
    (b) modulating the data being recalled in step (a);
    (c) adding predetermined data bit patterns to the data bits of each block of data being recalled in step (a);
    (d) demodulating independent bit rows by using at least two demodulation clocks differing in phase;
    (e) producing distinct demodulated data from each said demodulation clock;
    (f) comparing the distinct demodulated data to the data produced in step (c) to determine which distinct demodulated data is correct;
    (g) selecting the correct distinct demodulated data; and
    (h) delivering the selected demodulated data to an external apparatus.

2. The method as claimed in claim 1, wherein the demodulation clocks of said step (d) differ in phase by 180°.

3. A data modulation/demodulation system for reproducing correct data which has been divided and recorded in a plurality of blocks on a recording medium, comprising:
    recalling means for recalling data from the recording medium;
    pattern adding means, operatively connected to said recalling means, for providing a pattern signal produced by adding predetermined pattern data bits to the recalled data;
    modulating means, operatively connected to said recalling means, for modulating the recalled data;
    demodulating means, operatively connected to said modulating means, for independently demodulating bit rows by using demodulation clocks having different phases, thereby producing distinct demodulated data; and
    selecting means, operatively connected to said demodulating means and said pattern adding means, for comparing the distinct demodulated data with said pattern signal to determine which distinct demodulated data are correct, for selecting the correct distinct demodulated data, and for transmitting the correct distinct demodulated data to an external device.

4. The system as claimed in claim 3, wherein said demodulation clocks are 180° out of phase.

* * * * *